(12) United States Patent
Okawa et al.

(10) Patent No.: US 9,214,228 B1
(45) Date of Patent: Dec. 15, 2015

(54) SEMICONDUCTOR MEMORY DEVICE AND METHOD OF FORMING THEREOF

(71) Applicant: Kabushiki Kaisha Toshiba, Minato-ku (JP)

(72) Inventors: Takamasa Okawa, Yokkaichi (JP); Takayuki Tsukamoto, Yokkaichi (JP); Yoichi Minemura, Yokkaichi (JP); Hiroshi Kanno, Yokkaichi (JP); Atsushi Yoshida, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 63 days.

(21) Appl. No.: 14/105,641

(22) Filed: Dec. 13, 2013

Related U.S. Application Data

(60) Provisional application No. 61/868,638, filed on Aug. 22, 2013.

(51) Int. Cl.
*G11C 11/16* (2006.01)
*G11C 13/00* (2006.01)

(52) U.S. Cl.
CPC ............ *G11C 13/0069* (2013.01); *G11C 11/16* (2013.01); *G11C 13/0002* (2013.01)

(58) Field of Classification Search
CPC . G11C 11/5628; G11C 13/0069; G11C 11/16
USPC .................................................. 365/148, 158
See application file for complete search history.

(56) References Cited

U.S. PATENT DOCUMENTS

| | | | |
|---|---|---|---|
| 7,796,416 B2 * | 9/2010 | Ishihara | H01L 27/101 365/100 |
| 8,023,313 B2 | 9/2011 | Toda | |
| 8,120,942 B2 | 2/2012 | Yamaguchi et al. | |
| 8,411,488 B2 * | 4/2013 | Kawabata | G11C 11/5685 365/148 |
| 8,421,051 B2 * | 4/2013 | Sato | H01L 45/12 257/3 |
| 8,422,269 B2 * | 4/2013 | Sasaki | G11C 13/0026 365/148 |
| 2007/0195590 A1 * | 8/2007 | Sugita | 365/163 |
| 2010/0314602 A1 | 12/2010 | Takano et al. | |
| 2011/0037043 A1 * | 2/2011 | Wada | G11C 13/0007 257/2 |
| 2011/0205782 A1 * | 8/2011 | Costa et al. | 365/148 |

(Continued)

FOREIGN PATENT DOCUMENTS

| | | |
|---|---|---|
| JP | 2010-55719 | 3/2010 |
| JP | 2010-225750 | 10/2010 |

(Continued)

OTHER PUBLICATIONS

Y.H. Kang et al., Solid State Communications 151 (2011) 1739-1742.*

*Primary Examiner* — Michael Tran
(74) *Attorney, Agent, or Firm* — Oblon, McClelland, Maier & Neustadt, L.L.P.

(57) ABSTRACT

A semiconductor memory device has a memory cell array including memory cells, the memory cell being disposed at an intersection of first lines and second lines, the second lines being disposed intersecting the first lines, and the memory cell including a variable resistance element; and a control circuit. The control circuit is configured to execute a forming operation sequentially on a plurality of the memory cells. The control circuit applies a forming voltage to a selected memory cell of the memory cells, and controls the forming voltage such that the forming voltage is lower as the forming operation progresses.

18 Claims, 13 Drawing Sheets

(56) References Cited

U.S. PATENT DOCUMENTS

| | | | |
|---|---|---|---|
| 2012/0026804 A1* | 2/2012 | Nagashima | G11C 5/02 365/189.06 |
| 2012/0033512 A1* | 2/2012 | Takase | G11C 8/005 365/191 |
| 2012/0045705 A1* | 2/2012 | Kumei | H01M 9/04902 429/431 |
| 2012/0099367 A1 | 4/2012 | Azuma et al. | |
| 2012/0104351 A1* | 5/2012 | Wei | H01L 27/2409 257/4 |
| 2012/0182804 A1* | 7/2012 | Hung et al. | 365/185.13 |
| 2012/0223284 A1 | 9/2012 | Tamai | |
| 2012/0300532 A1* | 11/2012 | Yamazaki | H01L 45/08 365/148 |
| 2013/0003436 A1* | 1/2013 | Kumar | 365/100 |
| 2013/0021835 A1* | 1/2013 | Hwang et al. | 365/148 |
| 2013/0039125 A1* | 2/2013 | Kim | 365/185.02 |
| 2013/0095633 A1* | 4/2013 | Kakegawa | H01L 45/04 438/382 |
| 2014/0042383 A1* | 2/2014 | Inokuma et al. | 257/4 |
| 2014/0078811 A1* | 3/2014 | Kawai | G11C 13/00 365/148 |
| 2014/0091272 A1* | 4/2014 | Liao | H01L 45/08 257/4 |
| 2014/0312293 A1* | 10/2014 | Mikawa | H01L 45/08 257/4 |

FOREIGN PATENT DOCUMENTS

| | | |
|---|---|---|
| JP | 2010-287683 | 12/2010 |
| JP | 4860787 | 1/2012 |
| JP | 2012-186253 | 9/2012 |

* cited by examiner

SEMICONDUCTOR MEMORY DEVICE AND METHOD OF FORMING THEREOF

CROSS REFERENCE TO RELATED APPLICATIONS

This application is based on and claims the benefit of priority from prior US prior provisional Patent Application No. 61/868,638, filed on Aug. 22, 2013, the entire contents of which are incorporated herein by reference.

FIELD

Embodiments described in the present specification relate to a semiconductor memory device and a method of forming thereof.

BACKGROUND

In recent years, a resistance varying memory device employing a variable resistance element as a storage element has been receiving attention.

In order to cause a variable resistance element to function as a memory cell of a resistance varying type memory, it may be required to perform a forming operation as an initial setting operation. This forming operation is performed by applying a certain forming voltage to the variable resistance element to form a filament path in the variable resistance element, thereby setting the variable resistance element to a certain resistance state.

There is a need for a semiconductor memory device capable of executing this forming operation efficiently and with low power consumption.

DETAILED DESCRIPTION

A semiconductor memory device in an embodiment described below comprises: a memory cell array including memory cells arranged therein, the memory cell being disposed at an intersection of a plurality of first lines and a plurality of second lines, the second lines being disposed intersecting the first lines, and the memory cell including a variable resistance element; and a control circuit that controls the memory cell array. The control circuit is configured to, in the case of executing a forming operation sequentially on a plurality of the memory cells, lower a forming voltage applied to the memory cell selected during the forming operation, as the forming operation progresses.

Next, embodiments of the present invention will be described in detail with reference to the drawings.

First Embodiment

Figure 1:
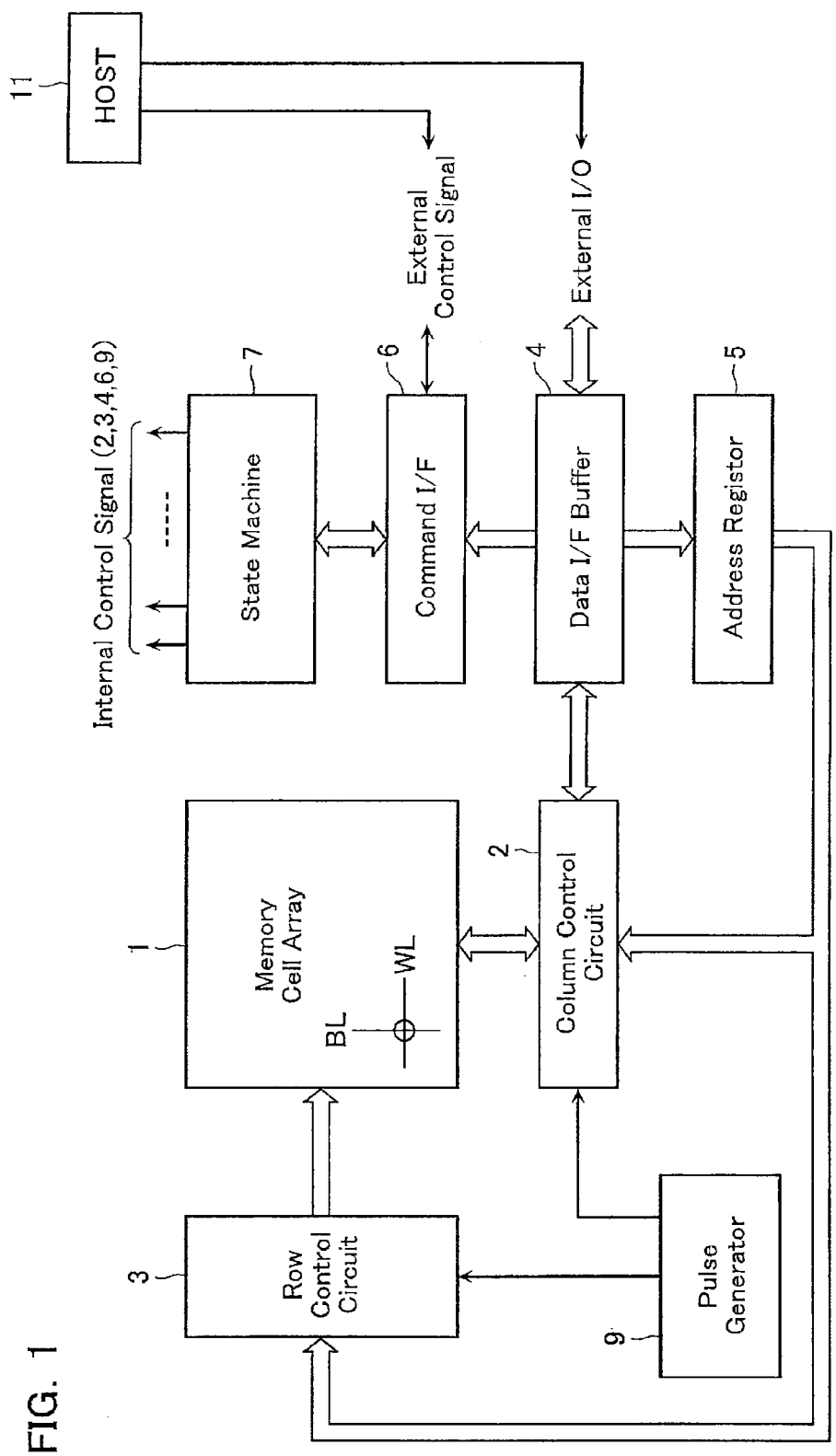
FIG. 1 is an example of a block diagram of a nonvolatile memory according to an embodiment.

FIG. 1 is an example of a block diagram of a nonvolatile memory according to a first embodiment.

This nonvolatile memory comprises a memory cell array 1 having memory cells disposed in a matrix therein, each memory cell using a variable resistance element which will be described later.

Provided at a position adjacent in a bit line BL direction of the memory cell array 1 is a column control circuit 2 that controls a bit line BL of the memory cell array 1 and applies a voltage for data write to the memory cell and data read from the memory cell.

Moreover, provided at a position adjacent in a word line WL direction of the memory cell array 1 is a row control circuit 3 capable of selecting a word line WL of the memory cell array 1 and applies a voltage for data write to the memory cell and data read from the memory cell.

A data input/output buffer 4 is connected to an external host 11 via an I/O line to receive write data, output read data, and receive address data or command.

The data input/output buffer 4 sends received write data to the column control circuit 2, and receives data read from the column control circuit 2 to be outputted to external host 11. An address supplied to the data input/output buffer 4 from external is sent to the column control circuit 2 and the row control circuit 3 via an address register 5.

In addition, the command interface 6 receives an external control signal from the host 11, judges whether data inputted to the data input/output buffer 4 is write data or a command or an address, and if a command, receives the data and transfers the data to a state machine 7 as a command signal.

The state machine 7 is capable of controlling this nonvolatile memory overall, receiving a command from the host 11 via the command interface 6, and performing read, write, management of input/output of data, and so on. In addition, it is also possible for status information controlled by the state machine 7 to be received by the external host 11, thereby enabling an operation result to be judged by the external host 11. Moreover, this status information is utilized also in control of write. Furthermore, the state machine 7 is capable of controlling a pulse generator 9. The pulse generator 9 is capable of outputting a pulse of any voltage and any timing. The pulse generator 9 generates these pulses based on a voltage supplied from a voltage generating circuit.

Now, the generated pulse can be transferred to any line selected by the column control circuit 2 and the row control circuit 3. Note that elements of peripheral circuits other than the memory cell array 1 can be formed on a Si substrate directly below the memory cell array 1. Then, chip area of this nonvolatile memory can be made substantially equal to area of the memory cell array 1.

Figure 2:
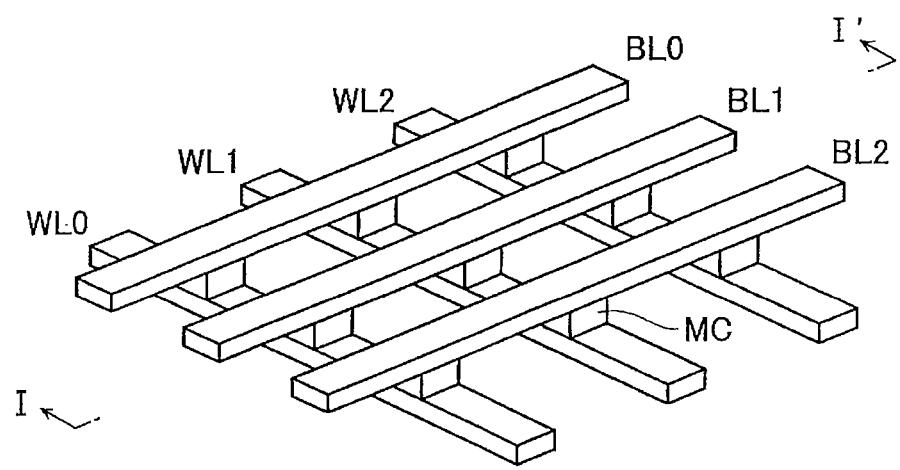
FIG. 2 is an example of a perspective view of part of a memory cell array 1.
Figure 3:
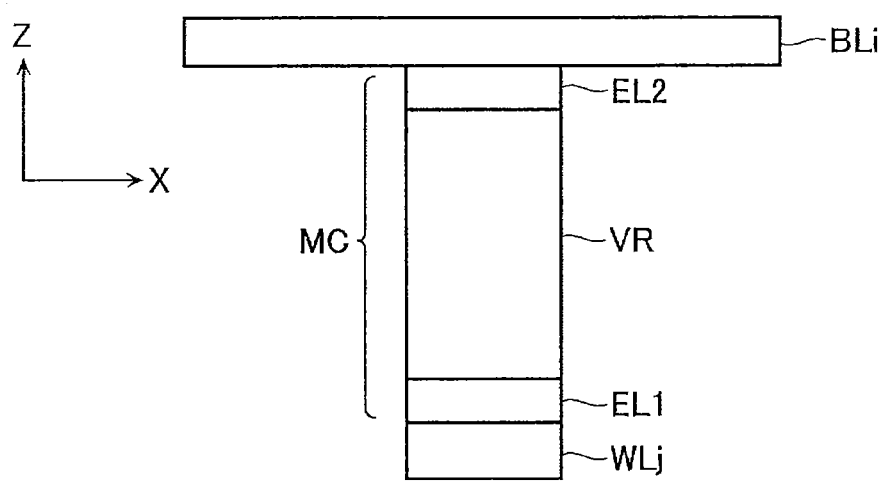
FIG. 3 is an example of a cross-sectional view of a single memory cell portion taken along the line I-I' looking in the direction of the arrows in FIG. 2.

FIG. 2 is a perspective view of part of the memory cell array 1, and FIG. 3 is a cross-sectional view of a single memory cell portion taken along the line I-I' and looking in the direction of the arrows in FIG. 2. Word lines WL0-WL2 acting as a plurality of first lines are arranged in parallel, bit lines BL0-BL2 acting as second lines are arranged in parallel intersecting these word lines WL0-WL2, and a memory cell MC is disposed at each of intersections of these word lines and bit lines to be sandwiched by both lines. The first and second lines are desirably of a material that is heat resistant and has a low resistance value. For example, the likes of W, WSi, NiSi, and CoSi may be employed as the material.

As shown in FIG. 3, the memory cell MC is a circuit having a variable resistance element VR connected between the bit line BL and the word line WL. Disposed below and above the variable resistance element VR in a Z direction are electrodes EL1 and EL2 that function as a barrier metal and an adhesive layer. The variable resistance element VR is disposed on the electrode EL1, and the electrode EL2 is disposed on the variable resistance element VR. As an electrode material of the electrode EL2, a material is employed that includes a metal element that forms conductive filament. The following may be selected as the metal element employed in the electrode EL2, namely, for example, Ag, Ni, Co, Al, Zn, Ti, Ta, Cu, and so on. The electrode EL2 may also further have the following stacked therein, namely, impurity-doped silicon, W, Ti, $TiN_x$, $TiSi_x$, $TiSi_xN_y$, Ta, $TaN_x$, and $TaSi_xN_y$. Various kinds of metal elements may be used as the electrode EL1. The electrode EL1 may be selected from, for example, impurity-doped silicon, W, Ti, $TiN_x$, $TiSi_x$, $TiSi_xN_y$, Ta, $TaN_x$, and $TaSi_xN_y$, or stacked structures of these.

Figure 4:
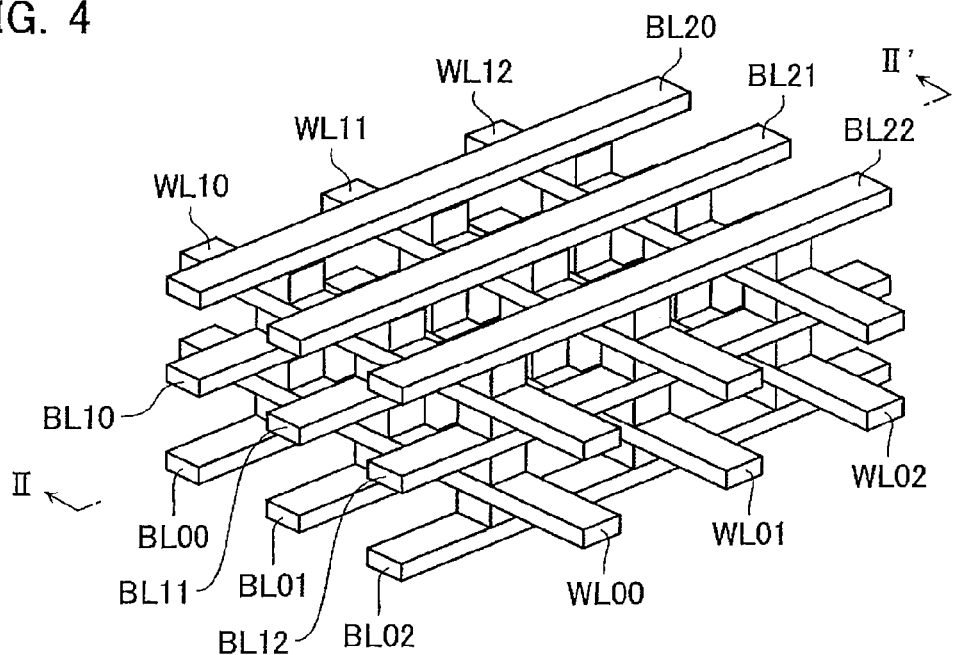
FIG. 4 is an example of a perspective view of part of the memory cell array 1 in the case of adopting a three-dimensional structure of a multiply stacked memory structure.
Figure 5:
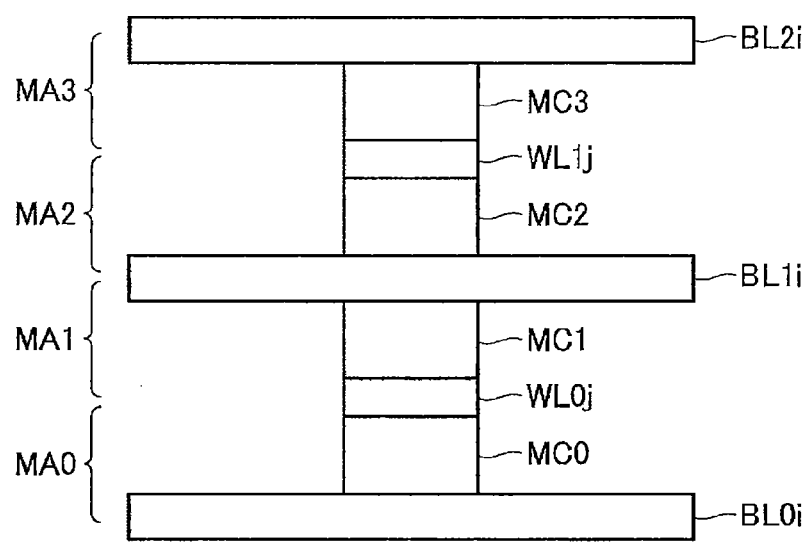
FIG. 5 is an example of a cross-sectional view taken along the line II-II' of FIG. 4.

In addition, as shown in FIG. 4, it is also possible to adopt a three-dimensional structure having the above-described memory structure multiply stacked. FIG. 5 is a cross-sectional view showing a cross-section taken along the line II-II' of FIG. 4. The example illustrated is a memory cell array having a four layer structure configured from cell array layers MA0-MA3. A word line WL0$j$ is shared by memory cells MC0 and MC1 below and above the word line WL0$j$, a bit line BL1$i$ is shared by memory cells MC1 and MC2 below and above the bit line BL1$i$, and a word line WL1$j$ is shared by memory cells MC2 and MC3 below and above the word line WL1$j$.

Moreover, it is also possible to adopt a configuration interposing an interlayer insulating film between cell array layers in the manner of line/cell/line/interlayer-insulating-layer/line/cell/line, instead of this repetition of line/cell/line/cell. Note that the memory cell array 1 may also be divided into several MATs of memory cell groups. The column control circuit 2 and the row control circuit 3 may be provided to each MAT, each sector, or each cell array layer MA, or may be shared by these. Moreover, these control circuits may also be shared by a plurality of bit lines BL for reduction of area.

In the memory cell array 1 shown in FIGS. 2-5, the word line WL and the bit line BL extend intersecting horizontally with respect to the substrate, and the memory cell is formed at the intersection of those word line WL and bit line BL.

Figure 6:
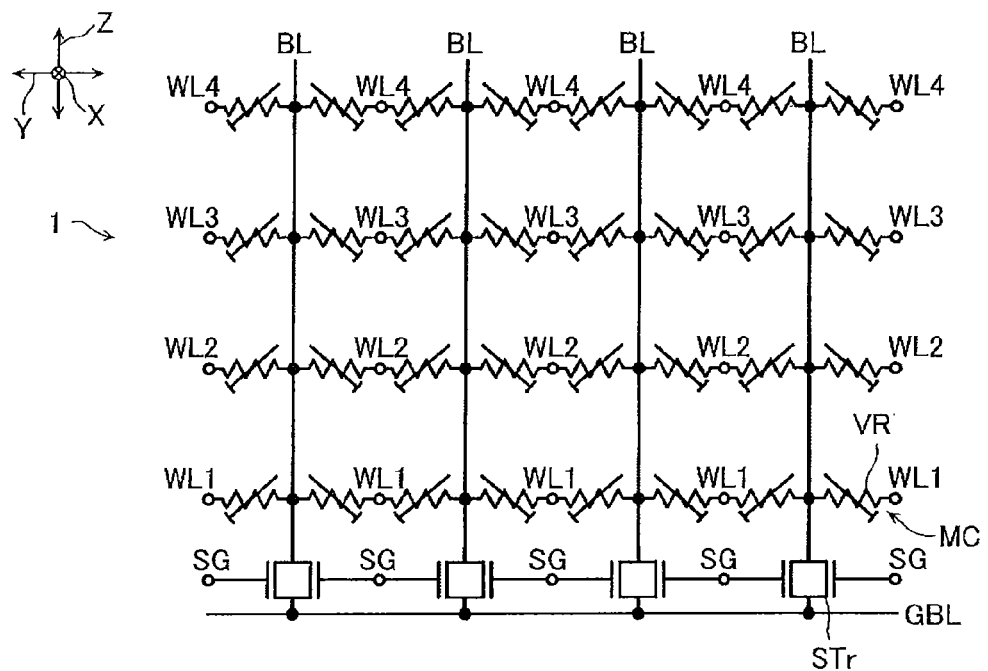
FIG. 6 is an example of a circuit diagram of a memory cell array according to the embodiment.
Figure 7:
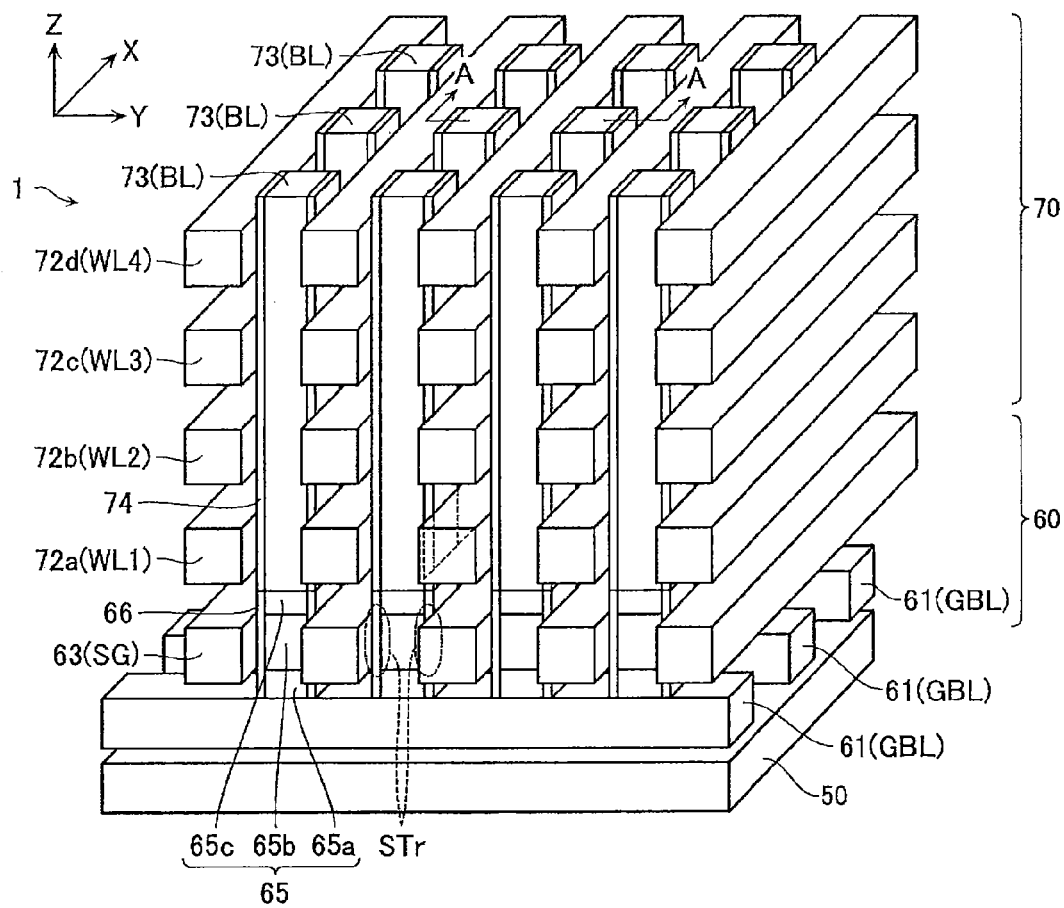
FIG. 7 is an example of a perspective view showing a stacked structure of the memory cell array according to the embodiment.
Figure 8:
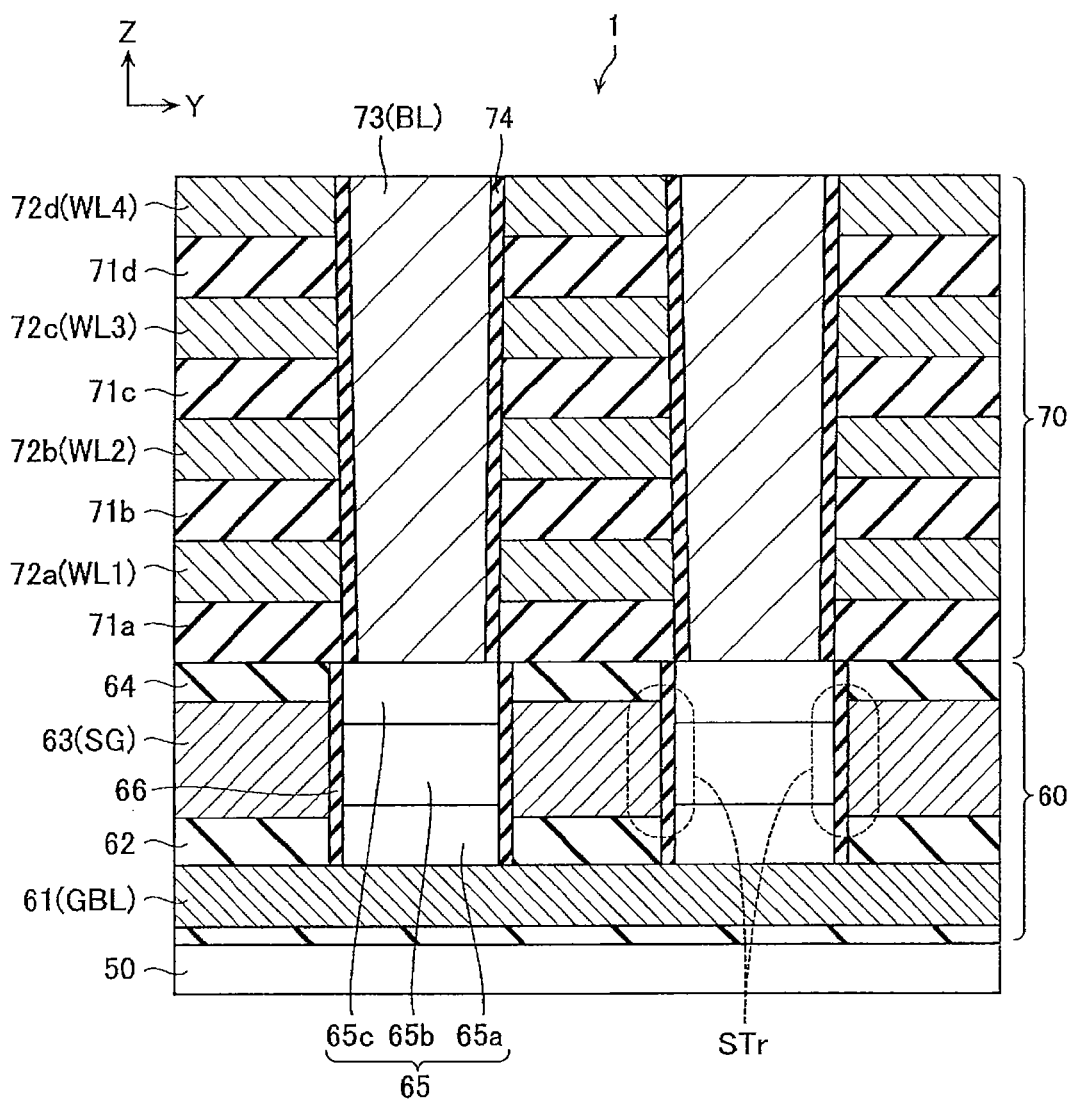
FIG. 8 is an example of a cross-sectional view of FIG. 7.

Instead of this, as shown in FIGS. 6-8, it is also possible to adopt a configuration where the memory cell is formed at the intersection of a bit line BL extending in a direction perpendicular to the substrate and a word line WL extending in a direction horizontal to the substrate.

An example of a structure of the memory cell array 1 will be described with reference to FIGS. 6-8. In this memory cell array 1, the bit line BL is formed extending in a direction perpendicular to the substrate.

First, an example of a circuit configuration of the memory cell array 1 will be described with reference to FIG. 6. Note that in FIG. 6, an X direction, a Y direction, and a Z direction are mutually orthogonal, and that the X direction is a direction perpendicular to a plane of paper. Moreover, the structure shown in FIG. 6 is provided repeatedly in the X direction.

As shown in FIG. 6, the memory cell array 1 includes a select transistor STr, a global bit line GBL, and a select gate line SG, besides the above-described word line WL, bit line BL, and memory cell MC.

As shown in FIG. 6, word lines WL1-WL4 are arranged in the Z direction and extend in the X direction. The bit lines BL are arranged in a matrix in the X direction and the Y direction and extend in the Z direction. The memory cells MC are disposed between word lines WL and bit lines BL. Therefore, the memory cells MC are arranged in a three-dimensional matrix in the X, Y, and Z directions.

As shown in FIG. 6, the select transistor STr is provided between the global bit line GBL and one end of the bit line BL. The global bit lines GBL are aligned in the X direction and extend in the Y direction. One global bit line GBL is commonly connected to one ends of a plurality of the select transistors STr arranged in a line in the Y direction. In other words, it could be said that the bit lines BL disposed in the Y direction are connected to one global bit line GBL. The select gate lines SG are aligned in the Y direction and extend in the X direction. One select gate line SG is commonly connected to gates of the select transistors STr arranged in a line in the X direction.

Next, a stacked structure of the memory cell array 1 will be described with reference to FIGS. 7 and 8. FIG. 7 is an example of a perspective view showing the stacked structure of the memory cell array 1. FIG. 8 is an example of a cross-sectional view taken along the line A-A of FIG. 7. Note that in FIG. 7, an interlayer insulating layer is omitted from illustration.

As shown in FIGS. 7 and 8, the memory cell array 1 includes a select transistor layer 60 and a memory layer that are stacked on a substrate 50. The select transistors STr are disposed in the select transistor layer 60, and the memory cells MC are disposed in the memory layer 70.

As shown in FIGS. 7 and 8, the select transistor layer 60 includes a conductive layer 61, an interlayer insulating layer 62, a conductive layer 63, and an interlayer insulating layer 64 that are stacked in the Z direction perpendicular to a principal plane of the substrate 50. The conductive layer 61 functions as the global bit line GBL, and the conductive layer 63 functions as the select gate line SG and as the gate of the select transistor STr.

The conductive layers 61 are aligned with a certain pitch in the X direction parallel to the principal plane of the substrate 50, and extend in the Y direction. The interlayer insulating layer 62 covers an upper surface of the conductive layer 61. The conductive layers 63 are aligned with a certain pitch in the Y direction, and extend in the X direction. The interlayer insulating layer 64 covers a side surface and an upper surface of the conductive layer 63. The conductive layers 61 and 63 are configured by, for example, polysilicon. The interlayer insulating layers 62 and 64 are formed of, for example, silicon oxide ($SiO_2$).

In addition, the select transistor layer 60 includes a columnar semiconductor layer 65 and a gate insulating layer 66. The columnar semiconductor layer 65 functions as a body (channel) of the select transistor STr, and the gate insulating layer 66 functions as a gate insulating film of the select transistor STr.

The columnar semiconductor layers 65 are disposed in a matrix in the X and Y directions, and extend in a column shape in the Z direction. Moreover, the columnar semiconductor layer 65 contacts the upper surface of the conductive layer 61, and contacts the side surface at an end in the Y direction of the conductive layer 63 via the gate insulating layer 66. In addition, the columnar semiconductor layer 65 includes, for example, an N+ type semiconductor layer 65a, a P+ type semiconductor layer 65b, and an N+ type semiconductor layer 65c that are stacked.

The N+ type semiconductor layer 65a contacts the interlayer insulating layer 62 at a side surface at an end in the Y direction thereof. The P+ type semiconductor layer 65b contacts the side surface of the conductive layer 63 at a side surface at an end in the Y direction thereof. The N+ type semiconductor layer 65c contacts the interlayer insulating layer 64 at a side surface at an end in the Y direction thereof. The N+ type semiconductor layers 65a and 65c are formed of polysilicon doped with an N+ type impurity, and the P+ type semiconductor layer 65b is formed of polysilicon doped with a P+ type impurity. The gate insulating layer 66 is configured by, for example, silicon oxide ($SiO_2$).

The memory layer 70 includes interlayer insulating layers 71a-71d and conductive layers 72a-72d that are stacked alternately in the Z direction. The conductive layers 72a-72d function as the word lines WL1-WL4. Each conductive layers 72a-72d is included in a pair of comb tooth shapes opposing in the X direction (not illustrated). The interlayer insulating layers 71a-71d are configured by, for example, silicon oxide ($SiO_2$), and the conductive layers 72a-72d are configured by, for example, polysilicon.

In addition, the memory layer 70 includes a columnar conductive layer 73 and a variable resistance layer 74. The columnar conductive layers 73 are disposed in a matrix in the X and Y directions contacting an upper surface of the columnar semiconductor layer 65, and extend in a column shape in the Z direction. The columnar conductive layer 73 functions as the bit line BL.

The variable resistance layer 74 is provided on a side surface at an end in the Y direction of the columnar conductive layer 73. The variable resistance layer 74 functions as the variable resistance element VR.

The variable resistance layer 74 is provided between the columnar conductive layer 73 and side surfaces at ends in the Y direction of the conductive layers 72a-72d.

The columnar conductive layer 73 is formed of, for example, polysilicon, and the variable resistance layer 74 is configured by, for example, a metal oxide (an oxide of Hf, W, Ti, Ta, or the like).

As described above, the memory cell array 1 includes two types, namely: a flat surface type memory cell array where the bit line BL and the word line WL extend in directions parallel to the substrate, as shown in FIGS. 1-5; and a structure where the bit line BL extends in a direction perpendicular to the substrate and the word line WL extends in a direction horizontal to the substrate, as shown in FIGS. 6-8. In either case, the memory cell MC includes a variable resistance element.

Immediately after manufacturing, this variable resistance element has an extremely high resistance value and has not been brought into a state that may be changed between a high-resistance state and a low-resistance state. Accordingly, a forming operation is executed in which the memory cell including the variable resistance element is applied with a forming voltage higher than a voltage for a setting operation and a resetting operation. Then, it is possible to change a resistance state between the high-resistance state and the low-resistance state (forming operation).

The present embodiment proposes a control method in the case of executing such a forming operation consecutively on memory cells.

Figure 9:
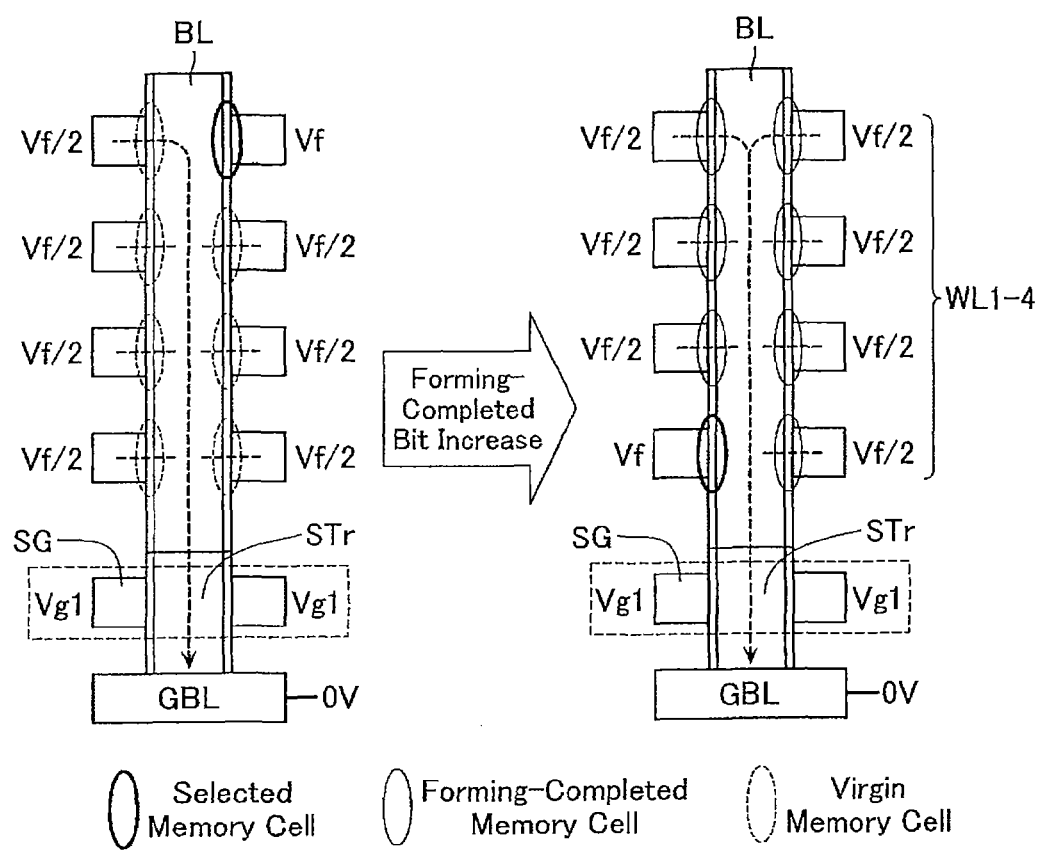
FIG. 9 is an example of a schematic view showing a procedure of a forming operation in a first embodiment.

FIG. 9 shows an example of the case of executing the forming operation consecutively on memory cells along one bit line BL. Note that FIG. 9 is described taking as an example the structure shown in FIGS. 6-8.

In FIG. 9, select gates SG on both sides of the select transistor STr connected to the bit line BL are applied with a voltage Vg1, thereby rendering the select transistor STr conductive. As a result, the bit line BL is provided with a voltage 0 V (ground potential) from the global bit line GBL via the select transistor STr. On the other hand, a selected word line is provided with a voltage Vf, and other unselected word lines are provided with a voltage which is smaller than this voltage Vf, for example, a voltage Vf/2. Therefore, a selected memory cell is applied with the voltage Vf to form the filament in the selected memory cell, while unselected memory cells are only applied with the voltage Vf/2, hence not to form the filament in the unselected memory cells.

In the case of executing the forming operation sequentially on the memory cells along one bit line BL by switching voltages, a leak current (sneak current) flowing in the unselected memory cells increases due to the number of memory cells that have had the forming operation completed. When the sneak current increases, it may cause malfunction of the circuit or destruction of memory cells. This will be described specifically in line with FIG. 9.

As shown on the left side of FIG. 9, when all of the unselected memory cells are memory cells where the forming operation is incomplete (Virgin Bit), a size of the sneak current is small. This is because a memory cell where the forming operation is incomplete has an extremely high resistance value.

On the other hand, as shown on the right side of FIG. 9, when the unselected memory cells are all forming operation-completed memory cells, the size of the sneak current is larger compared to in the left side of FIG. 9. This is because a forming operation-completed memory cell has a resistance value which is smaller compared to the case where the forming operation is incomplete. Explanation has been made, taking the structure shown in FIGS. 6-8 as an example, but a similar phenomenon occurs also in a structure shown in FIGS. 1-5.

Figure 10:
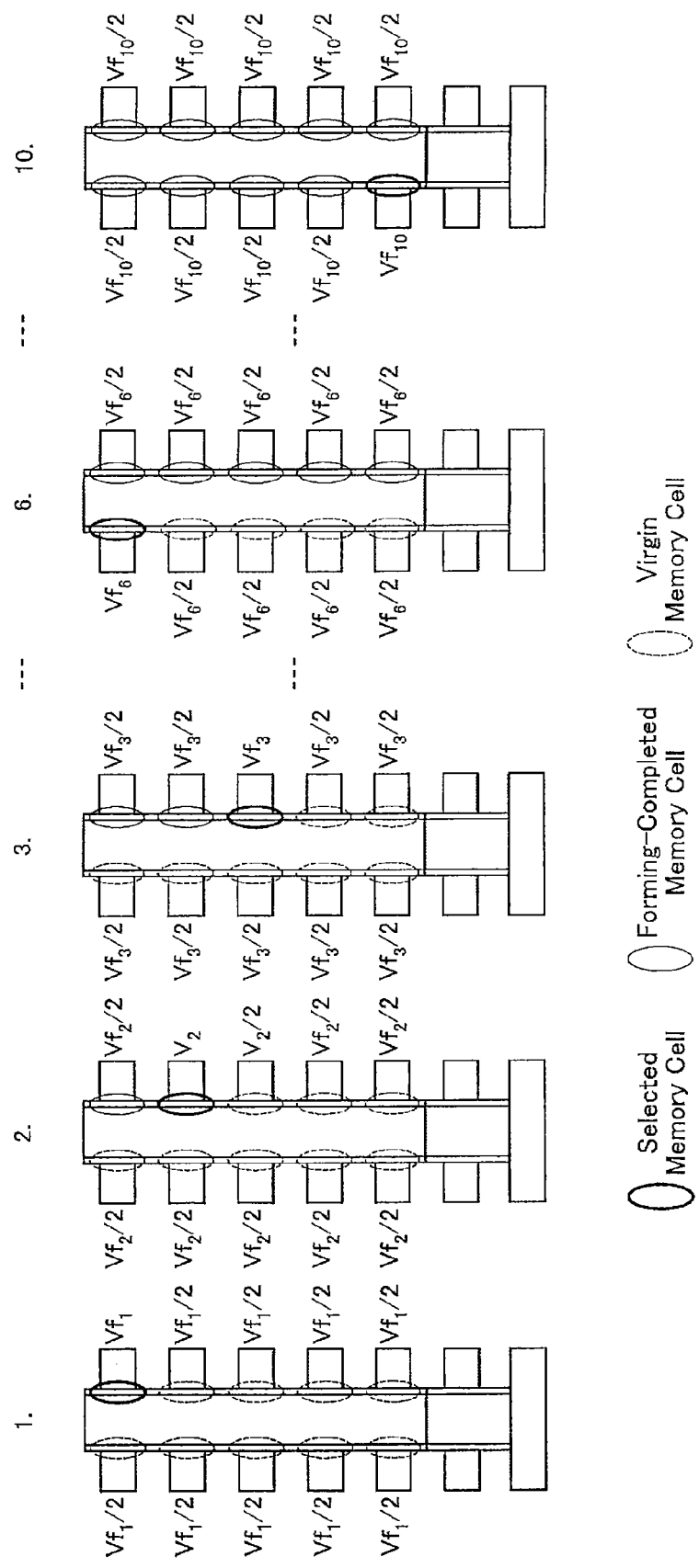
FIG. 10 is an example of a schematic view showing the procedure of the forming operation in the first embodiment.

The amount of the sneak current changes due to the number of forming operation-completed memory cells, so the inventors of this application propose an operation shown in FIG. 10. The control circuit of the present embodiment is configured to enable such an operation to be executed.

In this first embodiment, the control circuit is configured such that as the number of memory cells that have had the forming operation completed increases, a value of the forming voltage is more decreased. Specifically, as shown in "1." of FIG. 10, when the number of forming operation-completed memory cells among the memory cells along one bit line BL is zero, the forming voltage Vf applied to the selected word line WL is set to a maximum value of Vf1. On the other hand, a voltage applied to the unselected word lines WL is set to a value which is smaller than this Vf1, for example, Vf1/2.

Figure 11:
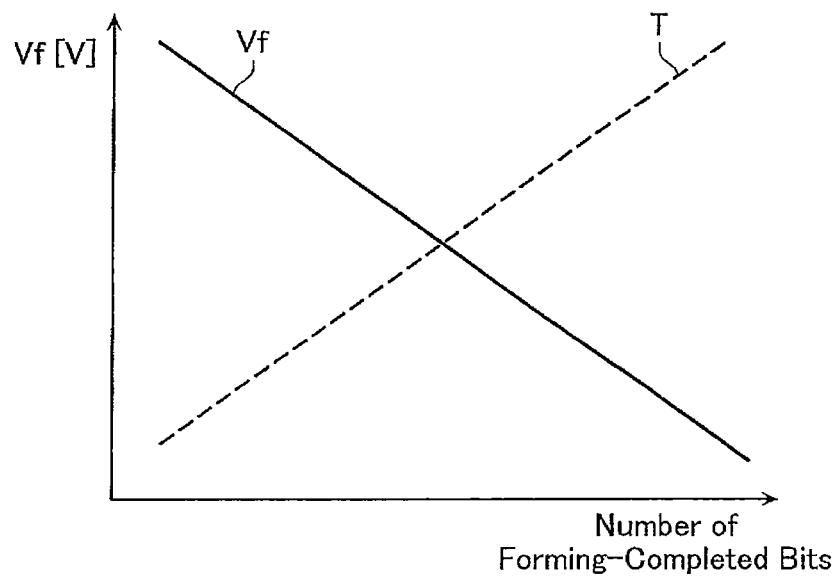
FIG. 11 is an example of a graph showing a relationship between a forming voltage Vf and the number of memory cells that have had the forming operation thereon completed.

Thereafter, as the forming operation progresses and the number of memory cells that have had the forming operation thereon completed increases, the value of the forming voltage Vf applied to the selected word line is gradually lowered (refer to FIG. 11). Moreover, the value of the voltage applied to the unselected word lines is also gradually lowered accordingly. As an example, the value of the forming voltage Vf applied to the selected word line is lowered sequentially, in the manner of Vf2, Vf3 (<Vf2), Vf4 (<Vf3), . . . , Vf6 . . . . Moreover, the value of the voltage applied to the unselected word lines is also lowered, in the manner of Vf2/2, Vf3/2, Vf4/2, . . . , Vf6/2 . . . .

In addition, it is preferable that as the number of memory cells that have had the forming operation completed increases, the forming voltage Vf is lowered, and in addition to this, a pulse width T of the forming voltage Vf is conversely increased (refer to FIG. 11). In other words, the voltage value of the forming voltage Vf and the pulse width T of the forming voltage Vf may be set to a substantially inversely proportional relationship as shown in FIG. 11. The pulse width T increasing can cover the lowering of the voltage value of the forming voltage Vf.

In the case that the forming voltage Vf applied to the selected memory cell lowers in the manner of Vf1, Vf2, Vf3, . . . , the voltage applied to the selected memory cell lowers, but the value of the previously-mentioned sneak current is reduced. Therefore, a voltage drop in the select transistor STr, and so on, decreases. As a result, a voltage can be applied to the selected memory cell more efficiently compared to the case where the same forming voltage Vf continues to be applied regardless of the increase in the number of memory cells that have had the forming operation completed as in FIG. 9. Moreover, since the sneak current is reduced, power consumption can be suppressed.

Note that the case of the structure shown in FIGS. 6-8 has been described above as an example, but a similar operation may be adopted also to a structure shown in FIGS. 1-5. For example, the forming operation can be performed by applying the selected bit line BL with 0 V and the selected word line WL with the forming voltage Vf, while applying the unselected bit lines BL with Vf and the unselected word lines WL with a voltage Vf/2. In this case, the value of the forming voltage Vf can be lowered in the manner of Vf1, Vf2, Vf3, . . . , based on the increase in forming operation-completed memory cells due to progression of the forming operation.

Figure 12:
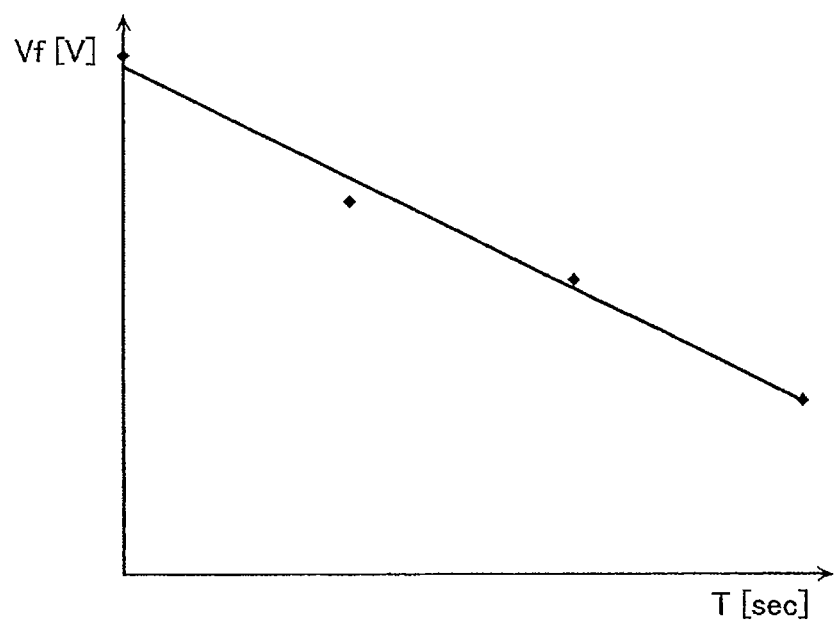
FIG. 12 is an example of a graph showing a relationship between a voltage value of the forming voltage Vf and a pulse width T of the forming voltage Vf.

In addition, the amount or pulse width of the forming voltage may be changed in a quadratic or exponential manner, instead of linearly as in FIGS. 11 and 12. Moreover, assuming two or more memory cells to be one memory cell group, the amount or pulse width of the forming voltage may be changed according to a memory cell group including the memory cells.

Second Embodiment

Figure 13:
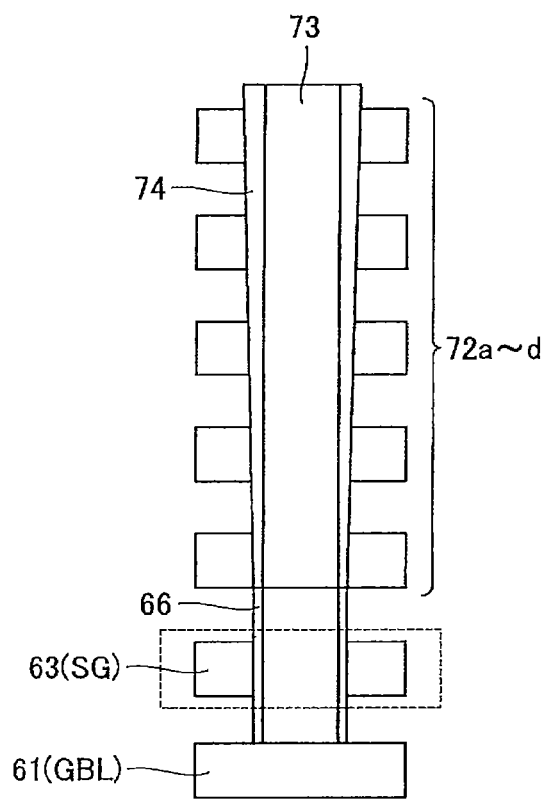
FIG. 13 is an example of a schematic view showing a configuration of a semiconductor memory device in a second embodiment.
Figure 14:
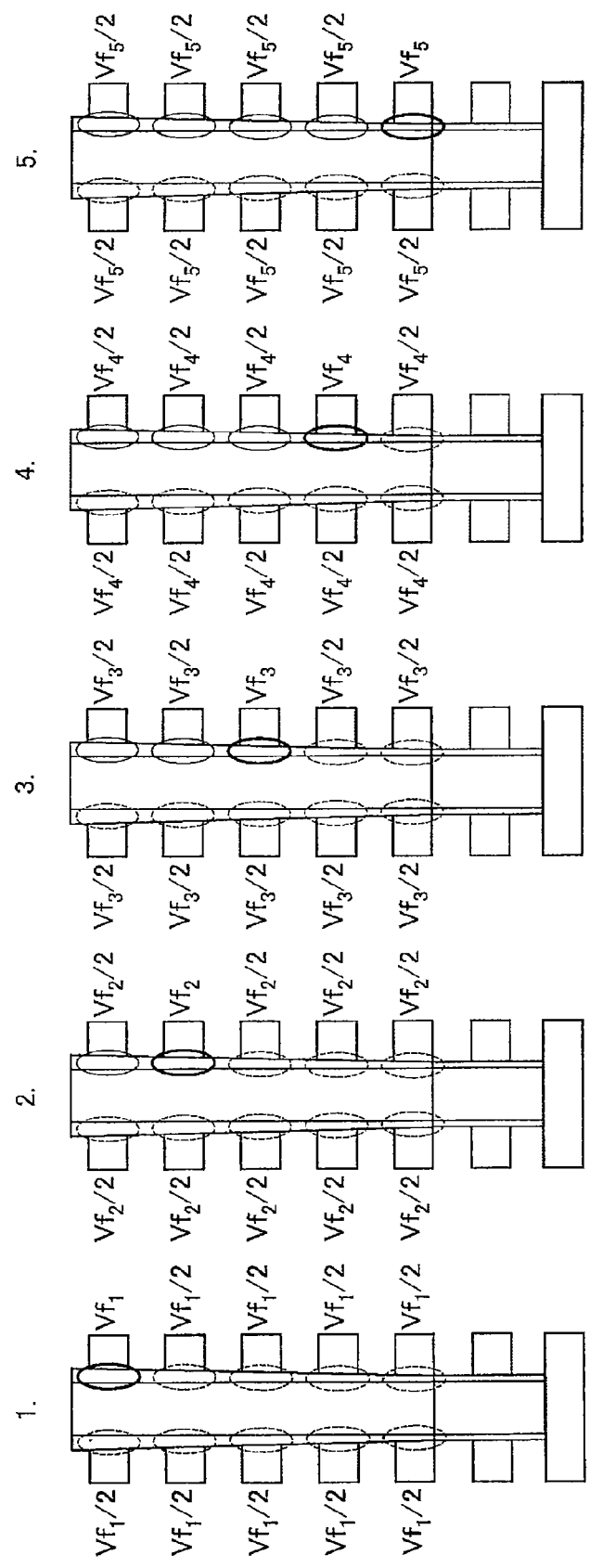
FIG. 14 is an example of a schematic view showing a procedure of a forming operation in the second embodiment.

Next, a semiconductor memory device according to a second embodiment will be described with reference to FIGS. 13 and 14. The semiconductor memory device of the second embodiment adopts the structure shown in FIGS. 6-8 as the memory cell array. In FIG. 13, configurative elements identical to those in FIGS. 6-8 are assigned with identical reference symbols to those assigned in FIGS. 6-8, hence a duplicated description of such configurative elements is omitted below.

In the memory cell array of this embodiment, a shape of the bit line BL has a reverse tapered shape becoming narrower in width as it is closer to a global bit line GBL side (substrate side). Moreover, a film thickness of the variable resistance layer 74 formed on a sidewall of the bit line BL is also configured in a reverse tapered shape becoming thinner as it is closer to the global bit line GBL side.

The semiconductor memory device of this second embodiment performs the following forming operation in a memory cell including the columnar conductive layer 73 having such a reverse tapered shape.

That is, when the columnar conductive layer 73 has a reverse tapered shape, the lower the layer in which the columnar conductive layer 73 is positioned, the film thickness of the variable resistance layer 74 becomes thinner as it is closer to the global bit line GBL side. A memory cell in a lower layer where the film thickness of the variable resistance layer 74 is thin can complete the forming operation by a lower forming voltage. Moreover, as a result, in the present embodiment, as shown in FIG. 14, from among memory cells along the columnar conductive layer 73, the forming operation is started from a memory cell that is in an upper layer which is a side far from the substrate. And the forming operation is continued while sequentially selecting the memory cell toward the lower layer. In addition, the voltage value of the applied forming voltage Vf is set to a value that is larger the more upwardly positioned is the layer of the memory cell (Vf1>Vf2>Vf3 . . . ). Moreover, the voltage applied to the unselected memory cells is also similarly reduced in the manner of Vf1/2, Vf2/2, Vf3/2 . . . .

In the case where such an operation is performed, the forming operation is enabled even when the forming voltage provided to a memory cell in a lower layer is low, and in a final stage of the forming operation when the sneak current increases, the forming operation can be completed at a lower forming voltage.

In addition, similarly to in the first embodiment, the forming voltage or the pulse width may be changed in a quadratic manner or in an exponential manner. Moreover, assuming two or more memory cells adjacent in a stacking direction to be one memory cell group, the size or pulse width of the forming voltage may be changed according to a memory cell group.

Figure 15:
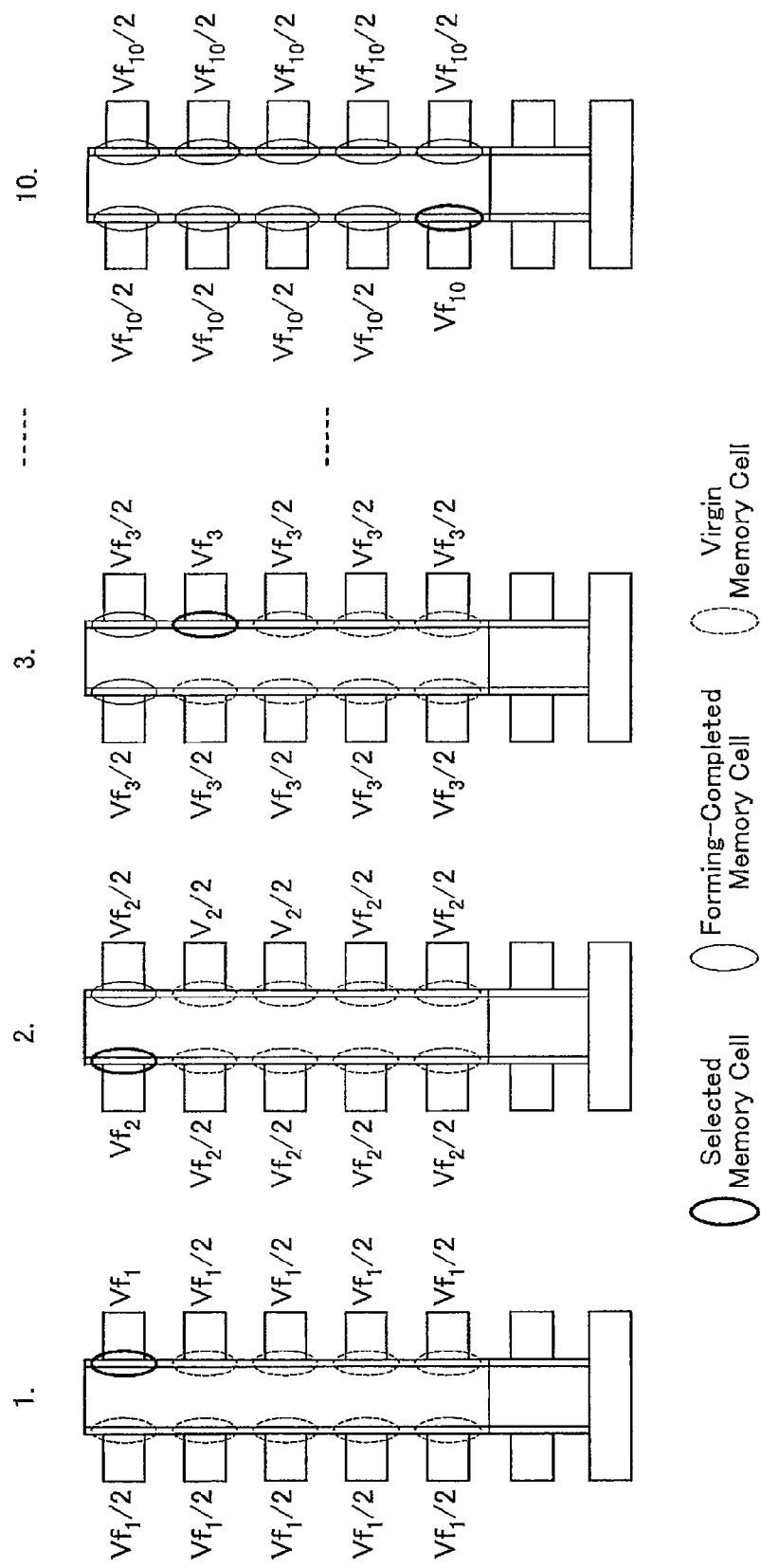
FIG. 15 is an example of a schematic view showing the procedure of the forming operation in the second embodiment.

Furthermore, as in FIG. 15, it is possible to adopt a procedure that, from an upper layer toward a lower layer, after performing the forming operation on two memory cells disposed in the same layer, next performs the forming operation sequentially on the two memory cells to left and right positioned in a layer one layer below. As a result, a high forming voltage can be provided to a memory cell where the film thickness of the variable resistance layer 74 is thick.

Third Embodiment

Next, a semiconductor memory device according to a third embodiment will be described with reference to FIG. 16. The semiconductor memory device of the third embodiment adopts the structure shown in FIGS. 6-8 as the memory cell array, similarly to the second embodiment.

Figure 16:
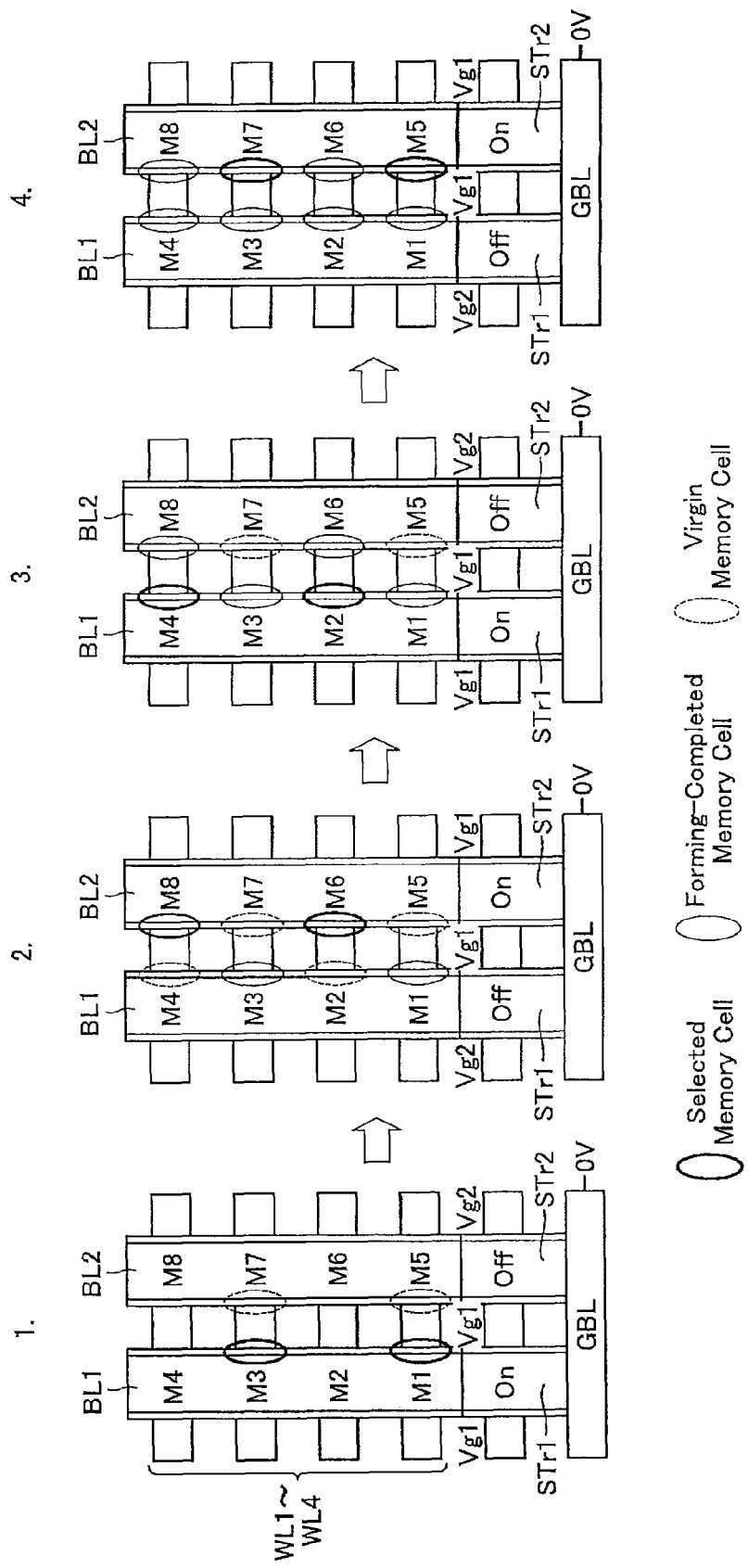
FIG. 16 is an example of a schematic view showing a procedure of a forming operation in a third embodiment.

As shown in FIG. 16, the semiconductor memory device of this third embodiment executes the forming operation alternately in a pair of bit lines BL (for example, BL1 and BL2) adjacent in a longitudinal direction (Y direction in FIG. 7) of the global bit line GBL. Sequentially selecting these two bit lines BL and applying voltages by the procedure below results in the forming operation being completed at a low forming voltage.

The procedure for application of voltages will be described with reference to FIG. 16.

First, as shown in "1." of FIG. 16, select gates SG on both sides of a select transistor STr1 connected to the bit line BL1 are applied with a voltage Vg1, thereby the select transistor STr1 is turned on. The global bit line GBL is applied with a voltage 0 V (ground potential), whereby the bit line BL1 is provided with 0 V. In this state, the word line WL1 is provided with the forming voltage Vf, whereby the forming operation on a memory cell M1 along the bit line BL1 is executed. Next, the word line WL3 is provided with the forming voltage Vf, whereby the forming operation on a memory cell M3 along the bit line BL1 is executed.

On the other hand, in a select transistor STr2 connected to the bit line BL2 adjacent to this bit line BL1, the select gate SG on one side is applied with the voltage Vg1, but the select gate SG on the other side is applied with a voltage Vg2, whereby the select transistor STr2 is turned off. As a result, the bit line BL2 is brought into a floating state. However, a leak current sometimes flows even when the select transistor STr2 is turned off. Therefore, in memory cells M5 and M7 that are at positions facing the previously-mentioned memory cells M1 and M3, the forming operation progresses slightly. Specifically, in the selected memory cells M1 and M3, a filament path is formed sufficiently by the forming operation, but a minute filament path is formed in part of the unselected memory cells M5 and M7. Accordingly, a partial forming operation progresses in such the unselected memory cells M5 and M7 (hereinafter, such memory cells are referred to as a memory cell that has been brought into soft-forming).

Next, as shown in "2." of FIG. 16, the select transistor STr2 is turned on, while the select transistor STr1 is turned off. As a result, the bit line BL2 is provided with 0 V, while the bit line BL1 is brought into a floating state. In this state, when the word line WL2 is provided with the forming voltage, the forming operation is executed in a memory cell M6 shown in the drawing. In this case, soft-forming progresses in a memory cell M2 that is at a facing position. Next, when the word line WL4 is provided with the forming voltage, the forming operation is executed in a memory cell M8 shown in the drawing. In this case, soft-forming progresses in a memory cell M4 that is at a facing position.

Thereafter, the selected bit line is switched in a similar manner to perform the forming operation sequentially in the memory cells M2 and M4, and following this, the forming operation is executed sequentially in the memory cells M5 and M7. Now, as shown in 2. of FIG. 16, the forming operation or soft-forming are completed on the memory cells M1-M8 disposed at intersections of the word lines WL shared by the bit lines BL1 and BL2. Then, as shown in "3." (and "4.") of FIG. 16, the forming operation of the memory cells M2, M4, M5, and M7 that have undergone soft-forming is executed. At this time, the forming operation progresses easily at a low forming voltage because these memory cells have undergone soft-forming at a stage of 1. and 2. of FIG. 16.

Therefore, the forming operation of this embodiment enables the forming operation to be completed at a lower forming voltage in a final stage of the forming operation when the sneak current increases. As a result, power consumption can be reduced.

[Other]

Figure 17:
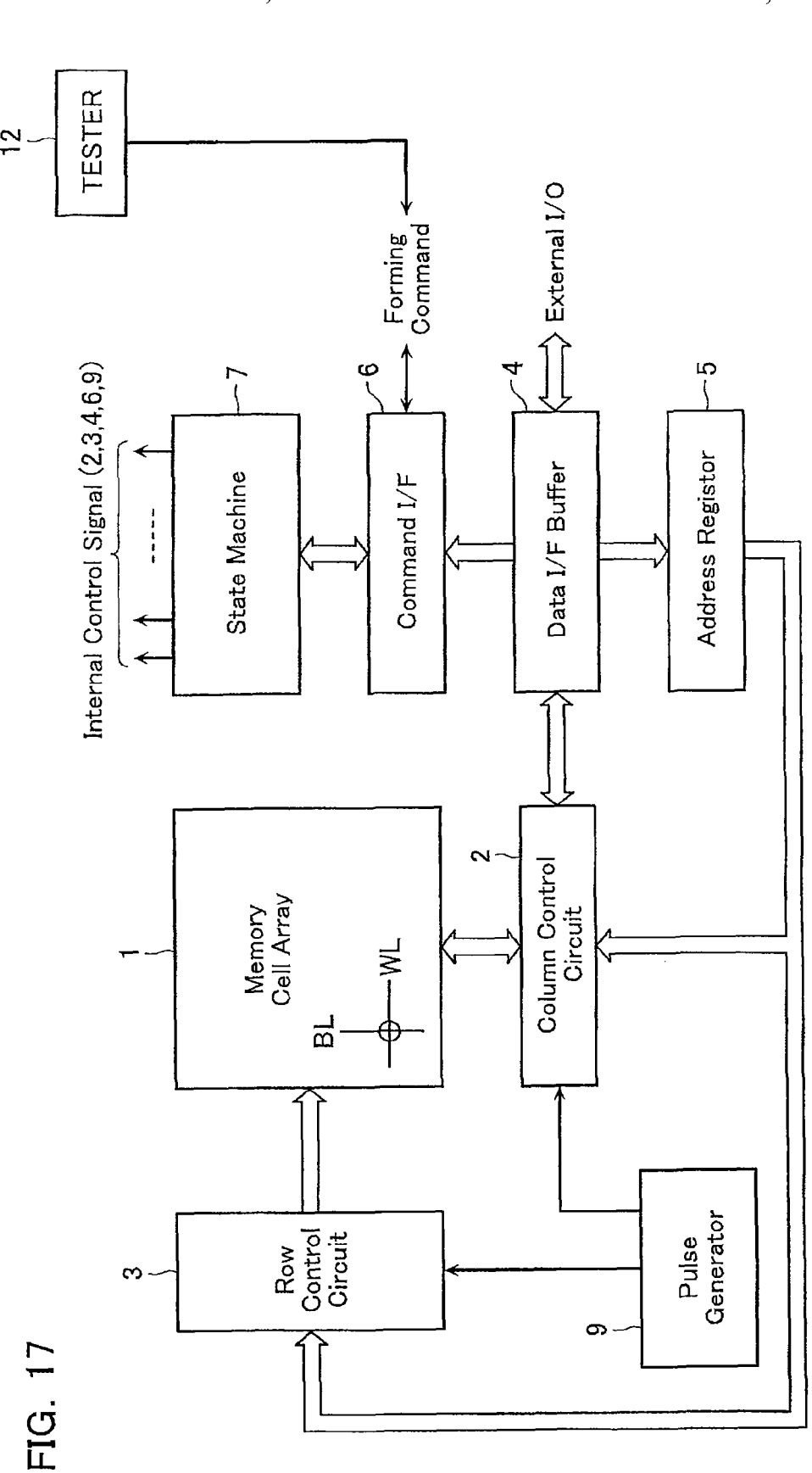
FIG. 17 is an example of a block diagram of a nonvolatile memory according to another embodiment.

As shown in FIG. 17, the forming operation can also be performed by a tester TST. The control circuit can execute the forming operation on the memory cell by sending a forming command to the command interface 6 from the tester TST.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array including memory cells, the memory cells being disposed at an intersection of first lines and second lines, the second lines being disposed intersecting the first lines, and the memory cell including a variable resistance element; and
a control circuit,
the control circuit being configured to execute a forming operation sequentially to the memory cells, and
applies a forming voltage to a selected memory cell of the memory cells, and control the forming voltage such that the forming voltage becomes lower as the forming operation progresses.

2. The semiconductor memory device according to claim 1, wherein
the control circuit is configured to execute the forming operation sequentially on first memory cells along the first line, and control the forming operation such that the forming voltage becomes lower according to the number of the first memory cells that have had the forming operation completed.

3. The semiconductor memory device according to claim 2, wherein
the control circuit applies the selected memory cell with the forming voltage,
while applying an unselected memory cell different from the selected memory cell with an unselected voltage smaller than the forming voltage.

4. The semiconductor memory device according to claim 3, wherein
the control circuit is configured to control the forming operation such that a voltage value of the forming voltage sequentially becomes lower, while an application time of the forming voltage becomes longer.

5. The semiconductor memory device according to claim 1, wherein
the first lines extend in a first direction which is a direction perpendicular to a substrate, and
a plurality of the second lines are disposed in the first direction and extend in a second direction which is a direction horizontal to the substrate.

6. The semiconductor memory device according to claim 5, wherein
the control circuit executes the forming operation sequentially on the memory cells along the first line.

7. The semiconductor memory device according to claim 5, wherein
the control circuit is configured to control the forming operation such that a voltage value of the forming voltage sequentially becomes lower, while an application time of the forming voltage becomes longer.

8. The semiconductor memory device according to claim 5, wherein
a film thickness of the variable resistance element becomes thicker as a distance of the variable resistance element from the substrate becomes larger, and the control circuit is configured to perform the forming operation sequentially from the memory cells along the first line that are on a side far from the substrate toward the memory cells along the first line that are on a side close to the substrate, and the forming voltage is lowered with increasing proximity to the substrate.

9. The semiconductor memory device according to claim 5, further comprising a third line extending in the first direction, the third line being adjacent to the first line, wherein the plurality of the second lines are shared by the first line and the third line, and the control circuit is configured to execute the forming operation on a first memory cell disposed at an intersection of the first line and a selected second line selected from the plurality of second lines, and then execute the forming operation on a second memory cell disposed at an intersection of the third line and the selected second line.

10. A method of forming of a semiconductor memory device, the semiconductor memory device comprising a memory cell array including memory cells, the memory cell being disposed at an intersection of first lines and second lines, the second lines being disposed intersecting the first lines, and the memory cell including a variable resistance element, the method comprising:

sequentially executing a forming operation to apply a forming voltage to a selected memory cell of the memory cells; and controlling the forming operation such that the forming voltage becomes lower as the forming operation progresses.

11. The method of forming according to claim 10, wherein the forming operation is executed sequentially on first memory cells along a first line; and the forming voltage is lowered according to the number of the first memory cells that have had the forming operation completed.

12. The method of forming according to claim 10, wherein the selected memory cell is applied with the forming voltage, while an unselected memory cell different from the selected memory cell is applied with an unselected voltage smaller than the forming voltage.

13. The method of forming according to claim 12, wherein a voltage value of the forming voltage sequentially becomes lower, while an application time of the forming voltage becomes longer.

14. The method of forming according to claim 10, wherein the first lines extend in a direction perpendicular to a substrate, a plurality of the second lines extend in a direction horizontal to the substrate, and the variable resistance element is sandwiched between each of the first lines and each of the second lines.

15. The method of forming according to claim 14, wherein the forming operation is sequentially executed on first memory cells along the first line; and the forming voltage is sequentially lowered according to the number of the first memory cells that have had the forming operation completed.

16. The method of forming according to claim 15, wherein a voltage value of the forming voltage sequentially becomes lower, while an application time of the forming voltage becomes longer.

17. The method of forming according to claim 13, wherein a film thickness of the variable resistance element becomes thicker the as a distance of the variable resistance element from the substrate becomes larger, the method further comprising:

performing the forming operation sequentially from the memory cells along the first line that are on a side far from the substrate toward the memory cells along the first line that are on a side close to the substrate; and lowering the forming voltage with increasing proximity to the substrate.

18. The method of forming according to claim 13, wherein at least two of the first lines commonly connected to an identical second line are alternately selected to execute the forming operation sequentially on the memory cells connected to the at least two of the second lines.

* * * * *